United States Patent [19]
Choi

[11] Patent Number: 5,801,998
[45] Date of Patent: Sep. 1, 1998

[54] DYNAMIC RANDOM ACCESS MEMORY

[75] Inventor: Jae Myoung Choi, Kyoungki-do, Rep. of Korea

[73] Assignee: Hyundai Electronics Industries Co., Ltd., Rep. of Korea

[21] Appl. No.: 740,951

[22] Filed: Nov. 5, 1996

[30] Foreign Application Priority Data

Nov. 6, 1995 [KR] Rep. of Korea ............... 1995-39981

[51] Int. Cl.$^6$ ............................................. G11C 7/00
[52] U.S. Cl. ................................. 365/193; 365/233
[58] Field of Search ............................. 365/193, 233, 365/230.01

[56] References Cited

U.S. PATENT DOCUMENTS

| | | | |
|---|---|---|---|
| 4,796,232 | 1/1989 | House | 365/189.03 |
| 4,998,222 | 3/1991 | Sussman | 365/193 |
| 5,251,176 | 10/1993 | Komatsu | 365/193 |
| 5,307,320 | 4/1994 | Farrer | 365/230.01 |
| 5,532,961 | 7/1996 | Mori | 365/193 |
| 5,600,604 | 2/1997 | Chen | 365/193 |

*Primary Examiner*—A. Zarabian
*Attorney, Agent, or Firm*—Gary M. Nath; Nath & Associates

[57] ABSTRACT

A dynamic random access memory including a cell array for storing data therein, a column address strobe bar buffer for generating at least one internal column address strobe signal in response to one external column address strobe bar signal to select data from the cell array, and an internal column address strobe enable signal generation circuit for generating at least one internal column address strobe enable signal to control the number of internal column address strobe signals from the column address strobe bar buffer. According to the present invention, one external column address strobe bar pin is used to generate internal multiple column address strobe signals. Therefore, the package size can be reduced and the time skew can be avoided. Furthermore, the internal multiple column address strobe signals are selectively enabled.

3 Claims, 5 Drawing Sheets

5,801,998

DYNAMIC RANDOM ACCESS MEMORY

BACKGROUND OF THE INVENTION

1. Field of the Invention

The present invention relates in general to semiconductor memory devices, and more particularly to a dynamic random access memory (referred to hereinafter as DRAM) in which one external column address strobe bar pin is used to generate internal multiple column address strobe signals, resulting in a reduction in package size.

2. Description of the Prior Art

Referring to FIG. 1, the construction of a conventional DRAM is shown in block form. As shown in this drawing, the DRAM comprises a column address strobe bar buffer (referred to hereinafter as /CAS buffer) 13 for generating internal multiple (for example, two) column address strobe signals ucas and lcas in response to external multiple column address strobe bar signals /UCAS and /LCAS. The internal column address strobe signals lcas and ucas from the /CAS buffer 13 are combined with data from cell array blocks 11 and 12 to select L-data and U-data, respectively.

In the above-mentioned conventional DRAM, the number of external column address strobe bar pins is the same as that of the internal column address strobe signals, and will hereinafter be described in more detail with reference to FIGS. 2A and 2B.

FIGS. 2A and 2B are logic circuit diagrams of the /CAS buffer 13 in FIG. 1. As shown in these drawings, the number of external column address strobe bar pins used to receive the external multiple column address strobe bar signals is the same as that of the internal column address strobe signals.

As the internal column address strobe signals increase in number, the external column address strobe bar pins also increase in number, resulting in an increase in package size. As a result, such an increase in the number of the /CAS buffer input terminal pins has a bad effect on the miniaturization desired by the system manufacturer. Furthermore, a time skew occurs between the external multiple column address strobe bar signals when they are simultaneously enabled. Such a time skew results in the faulty operation of the DRAM.

SUMMARY OF THE INVENTION

Therefore, the present invention has been made in view of the above problems, and it is an object of the present invention to provide a DRAM in which one external column address strobe bar pin is used to generate internal multiple column address strobe signals, so that the package size can be reduced, the time skew can be avoided, and the internal multiple column address strobe signals can be selectively enabled.

In accordance with the present invention, the above and other objects can be accomplished by a provision of a dynamic random access memory comprising a cell array for storing data therein; a column address strobe bar buffer for generating at least one internal column address strobe signal in response to one external column address strobe bar signal to select data from the cell array; and control means for generating at least one internal column address strobe enable signal to control the number of internal column address strobe signals from the column address strobe bar buffer.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
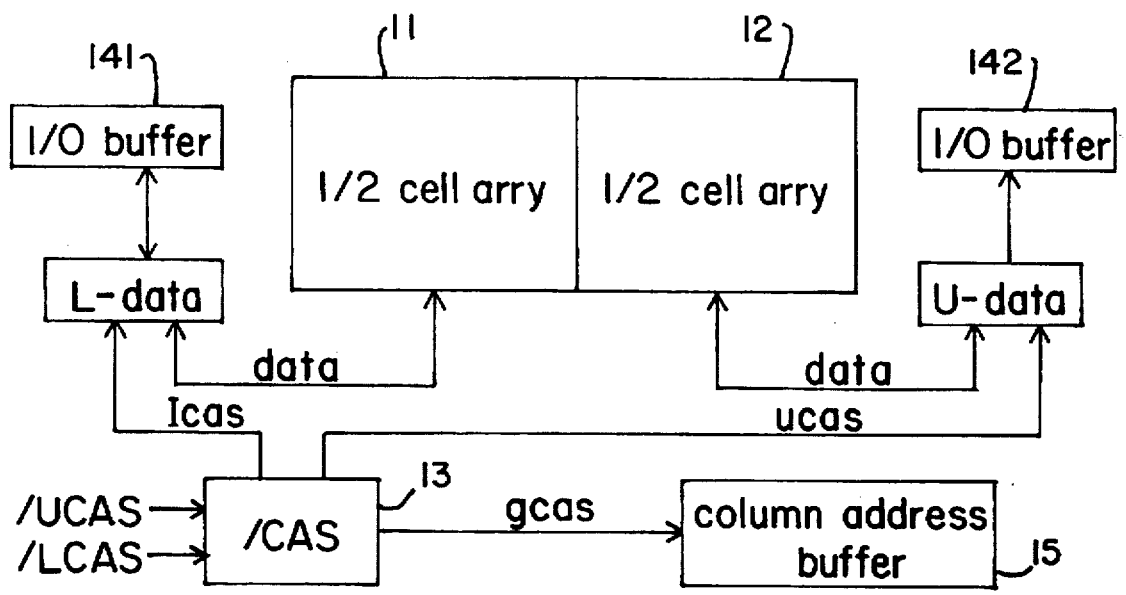
FIG. 1 is a block diagram illustrating the construction of a conventional DRAM.
Figure 3:
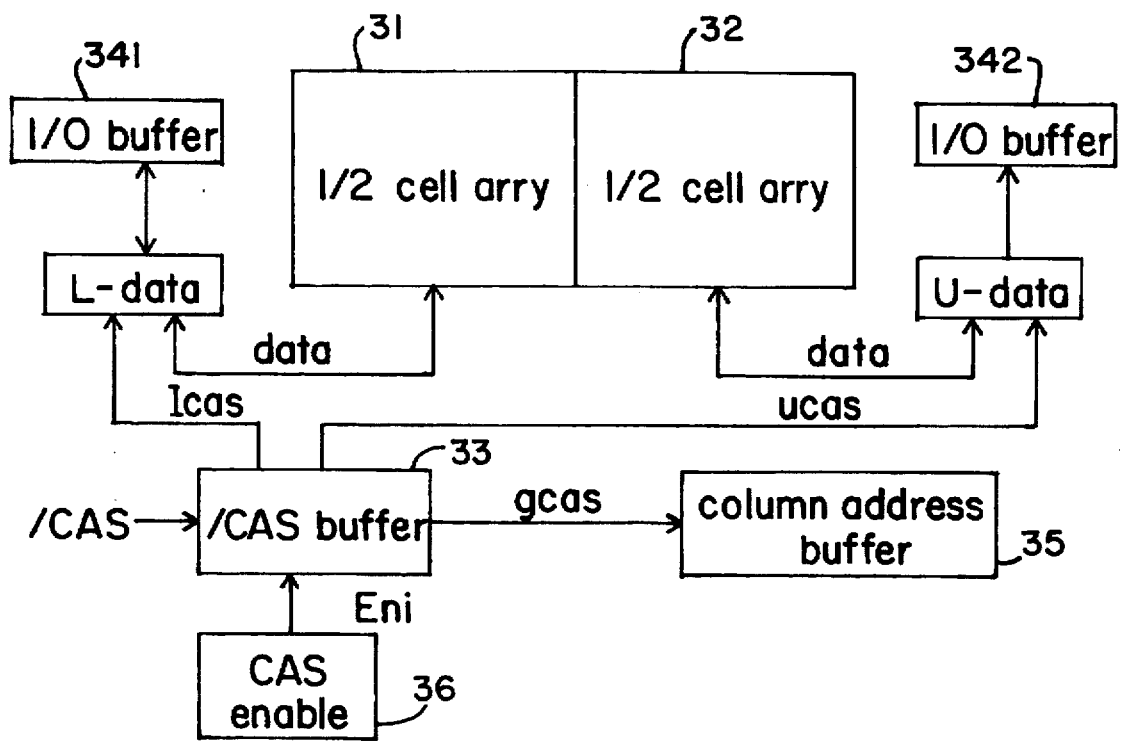
FIG. 3 is a block diagram illustrating the construction of a DRAM in accordance with an embodiment of the present invention.
Figure 2A:
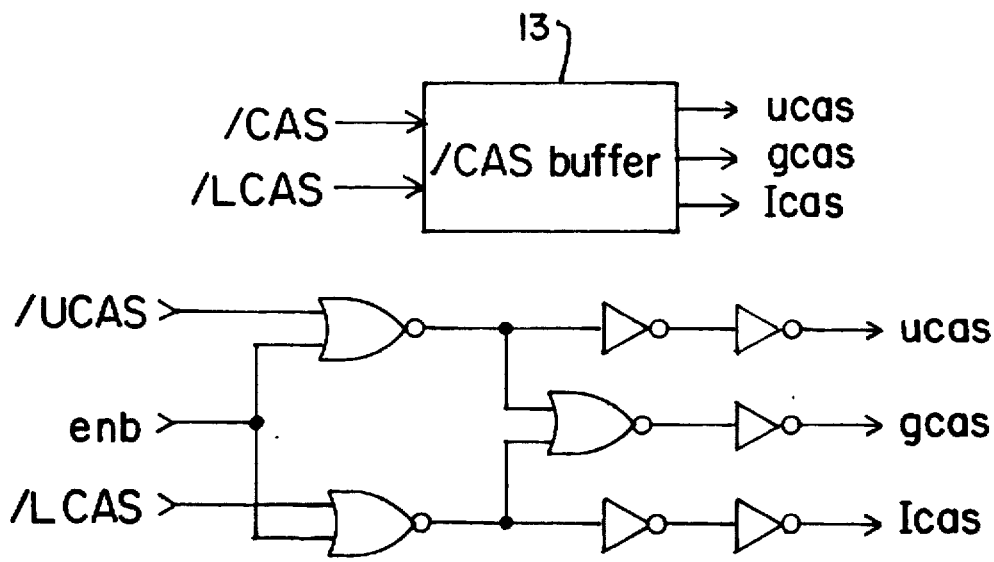
FIGS. 2A and 2B are logic circuit diagrams of a /CAS buffer in FIG. 1.
Figure 2B:
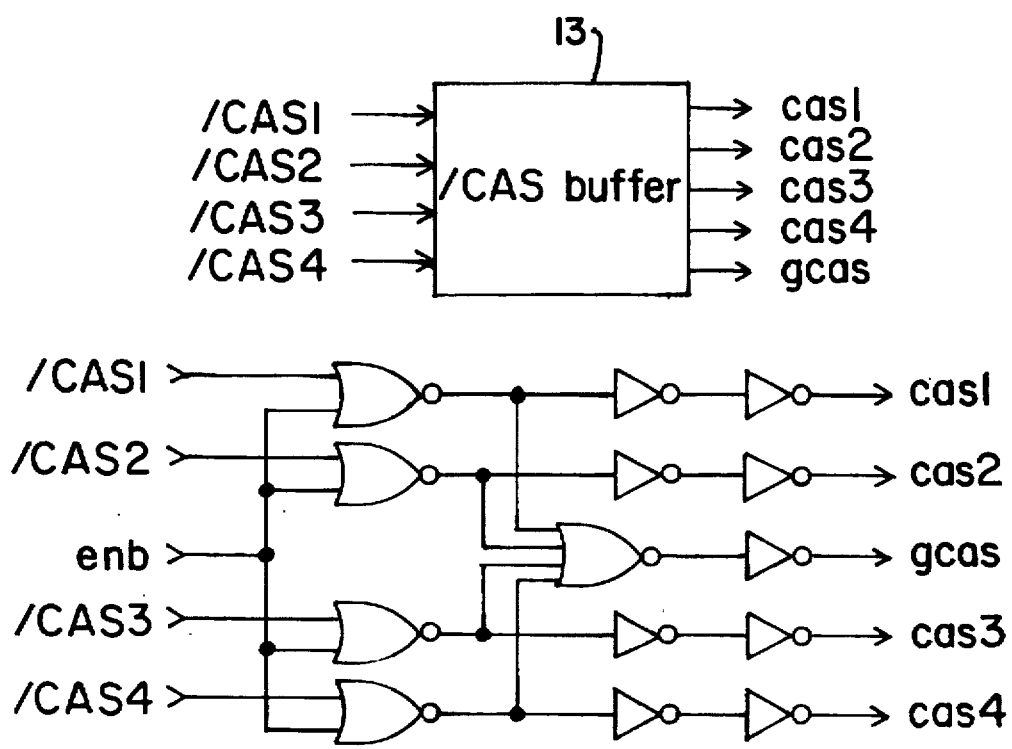

Referring to FIG. 3, the construction of a DRAM in accordance with an embodiment of the present invention is shown in block form. As shown in this drawing, the DRAM comprises cell array blocks 31 and 32 for storing data therein, a /CAS buffer 33 for generating at least one internal column address strobe signal in response to one external column address strobe bar signal /CAS to select data from the cell array blocks 31 and 32, and an internal column address strobe enable signal (referred to hereinafter as internal CAS enable signal) generation circuit 36 for generating at least one internal CAS enable signal ENi to control the number of internal column address strobe signals from the /CAS buffer 33. As seen from FIG. 3, the /CAS buffer 33 is adapted to receive the external column address strobe bar signal /CAS through one input pin. The /CAS buffer 33 generates a plurality of internal column address strobe signals in response to one external column address strobe bar signal /CAS, as will hereinafter be described in more detail with reference to FIGS. 4A and 4B.

Figure 4A:
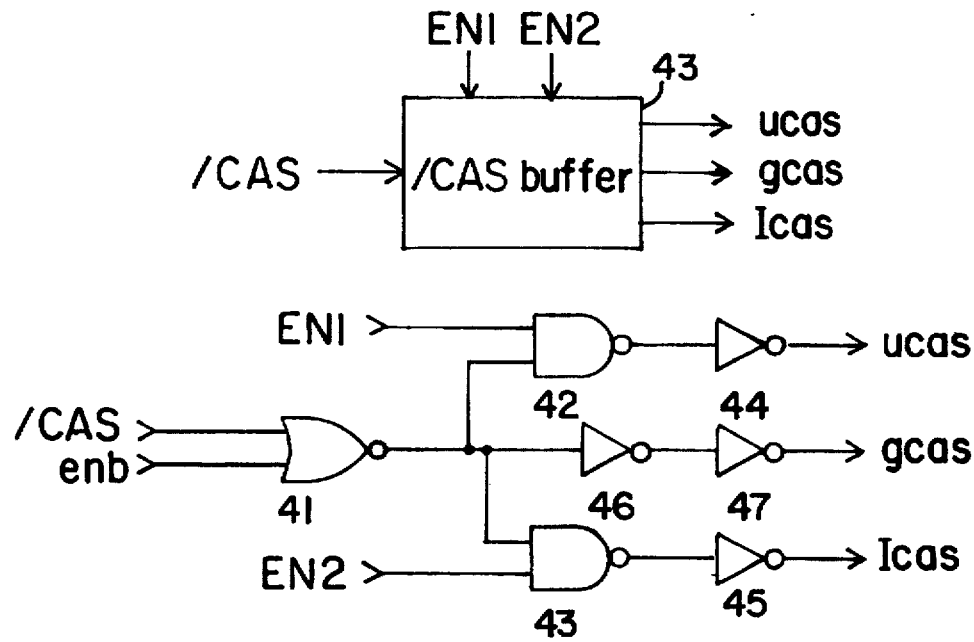
FIGS. 4A and 4B are logic circuit diagrams of a /CAS buffer in FIG. 3.
Figure 4B:
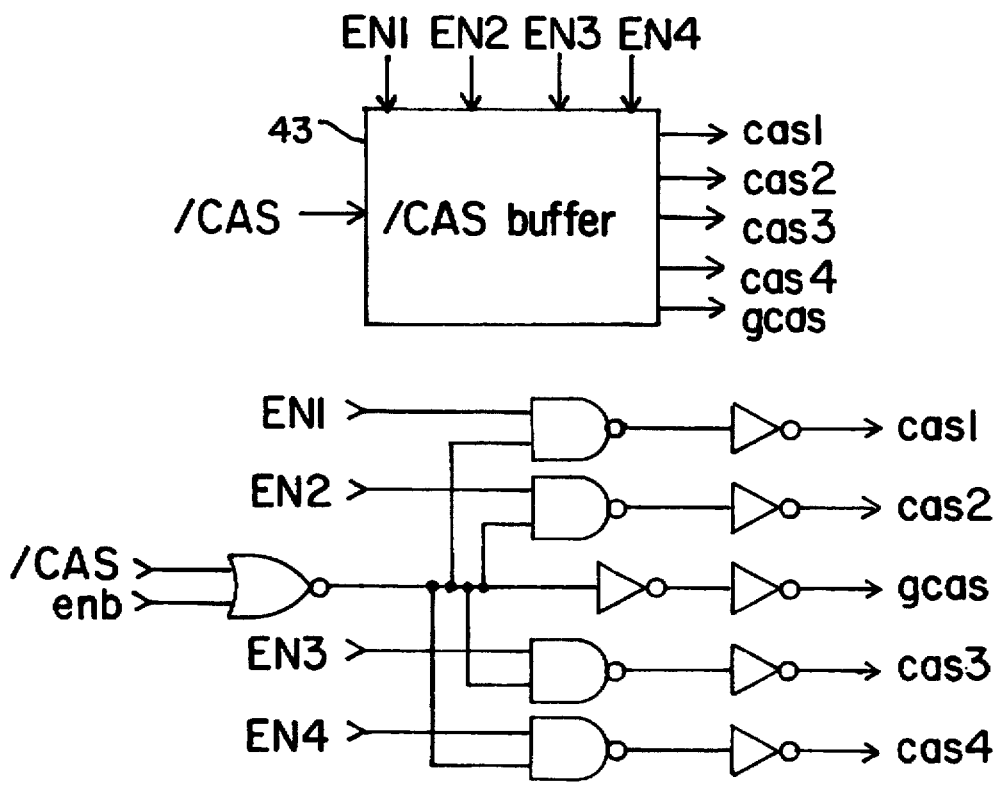

FIGS. 4A and 4B are logic circuit diagrams of the /CAS buffer 33 in FIG. 3. In FIG. 4A, the /CAS buffer 33 is constructed to generate internal multiple column address strobe signals ucas and lcas in response to the external column address strobe bar signal /CAS and the internal CAS enable signals EN1 and EN2 from the internal CAS enable signal generation circuit 36. In FIG. 4B, the /CAS buffer 33 is constructed to generate internal multiple column address strobe signals cas1–cas4 in response to the external column address strobe bar signal /CAS and the internal CAS enable signals EN1–EN4 from the internal CAS enable signal generation circuit 36. In other words, although the conventional /CAS buffer received a plurality of external column address strobe bar signals through a plurality of input pins, the present /CAS buffer receives one external column address strobe bar signal through one input pin.

The operation of the /CAS buffer 33 with the above-mentioned construction in accordance with the preferred embodiment of the present invention will hereinafter be described in detail with reference to FIGS. 4A and 4B.

In the case where the two internal column address strobe signals ucas and lcas are to be generated by the construction of FIG. 4A, the external column address strobe bar signal /CAS of low logic and a /CAS buffer enable signal enb of low logic are applied to a NOR gate 41 and the internal CAS enable signals EN1 and EN2 of high logic from the internal CAS enable signal generation circuit 36 are applied to first and second NAND gates 42 and 43, respectively.

As a result, the output of the NOR gate 41 goes high in logic, the output of the first NAND gate 42 goes low in logic and the internal column address strobe signal ucas or the output of a first inverter 44 goes high in logic.

Also, the output of the second NAND gate 43 goes low in logic and the internal column address strobe signal lcas or the output of a second inverter 45 goes high in logic.

In other words, the /CAS buffer 33 receives the external column address strobe bar signal /CAS in response to the /CAS buffer enable signal enb, which is made active and generates the internal column address strobe signals ucas and lcas in response to the internal CAS enable signals EN1 and EN2, which is made active.

The internal column address strobe signals lcas and ucas from the /CAS buffer 33 are combined with data from the cell array blocks 31 and 32 to select L-data and U-data, respectively. The selected L-data and U-data are inputted/outputted through first and second input/output (referred to hereinafter as I/O) buffers 341 and 342, respectively.

In the case where the internal multiple column address strobe signals cas1–cas4 are generated in response to the external column address strobe bar signal /CAS and the internal CAS enable signals EN1–EN4 from the internal CAS enable signal generation circuit 36 as shown in FIG. 4B, they are combined with data from the cell array blocks to select U1-data, U2-data, L1-data and L2-data, respectively. The selected U1-data, U2-data, L1-data and L2-data are inputted/outputted through first to fourth I/O buffers, respectively.

As mentioned above, the /CAS buffer of the present invention receives one external column address strobe bar signal /CAS and combines the received signal with a plurality of internal CAS enable signals from the internal CAS enable signal generation circuit 36 to generate internal multiple column address strobe signals.

Figure 5:
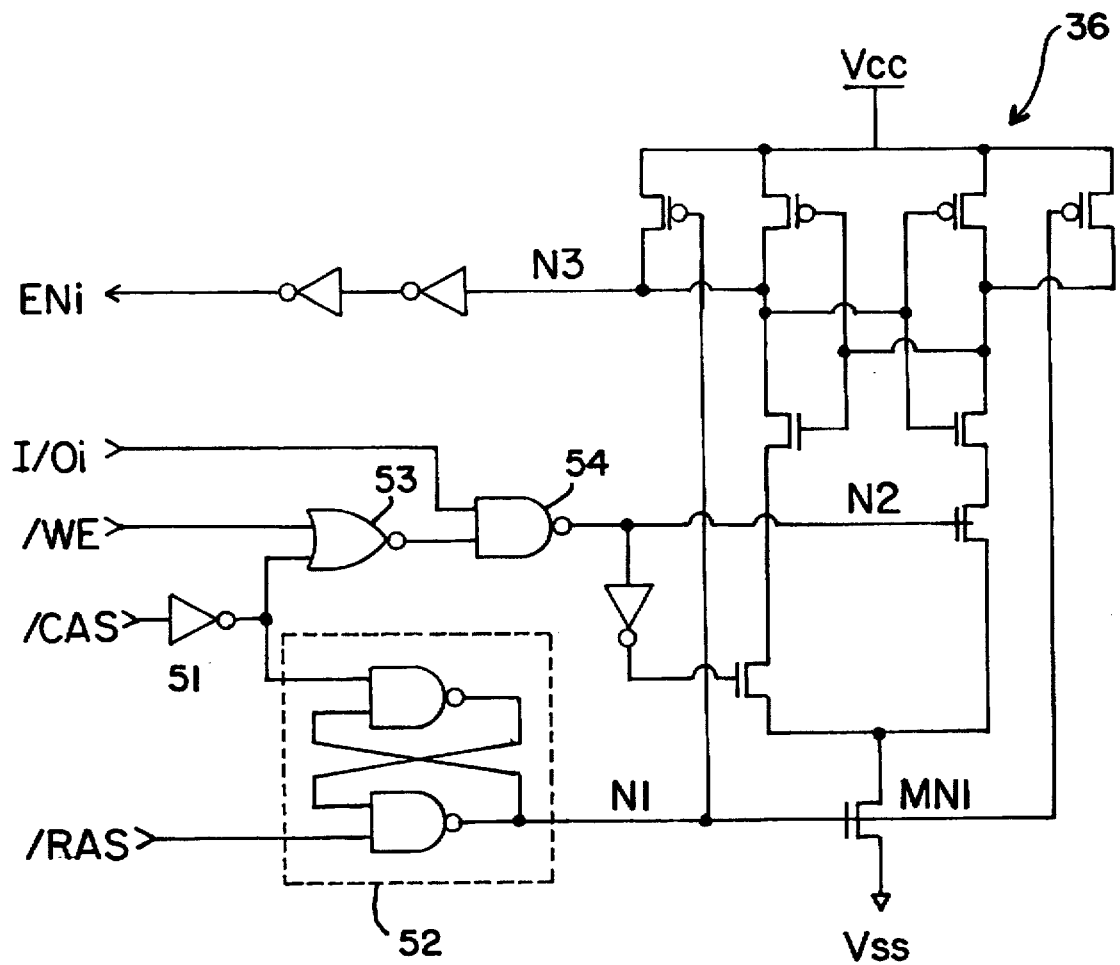
FIG. 5 is a circuit diagram of an internal column address strobe enable signal generation circuit in FIG. 3.

FIG. 5 is a circuit diagram of the internal CAS enable signal generation circuit 36 in FIG. 3. As shown in this drawing, the internal CAS enable signal generation circuit 36 is adapted to generate at least one internal CAS enable signal ENi in response to the external column address strobe bar signal /CAS, a row address strobe bar signal /RAS, and a write enable signal /WE and an input/output signal I/Oi. To this end, the internal CAS enable signal generation circuit 36 includes an operation controller 52 for controlling the circuit operation according to a logic state of the row address strobe bar signal /RAS when the external column address strobe bar signal /CAS is high in logic and the write enable signal /WE is low in logic, and logic gates 53 and 54 being driven in response to the write enable signal /WE being high in logic. As the logic gates 53 and 54 are driven, they generate at least one internal CAS enable signal ENi in response to the input/output signal I/Oi and control a logic state of the at least one internal CAS enable signal ENi according to a logic state of the input/output signal I/Oi.

The operation of the internal CAS enable signal generation circuit 36 with the above-mentioned construction in accordance with the preferred embodiment of the present invention will hereinafter be described in detail with reference to FIG. 5.

If the row address strobe bar signal /RAS is low in logic when the external column address strobe bar signal /CAS is high in logic and the write enable signal /WE is low in logic, a signal at a first node Ni or the latch output goes high in logic. The signal at the first node Ni is applied to a gate of an NMOS transistor MN1. As a result, the NMOS transistor MN1 is turned on, thereby allowing the entire circuit to be ready to operate.

At this time, if the input/output signal I/Oi is high in logic, a signal at a second node N2 becomes low in logic, thereby causing a signal at a third node N3 to go from high to low in logic. As a result, because the internal CAS enable signal ENi becomes low in logic, it cannot enable the corresponding internal column address strobe signal cas. In this case, data is masked to an I/O buffer corresponding to the disabled internal column address strobe signal cas.

Figure 6:
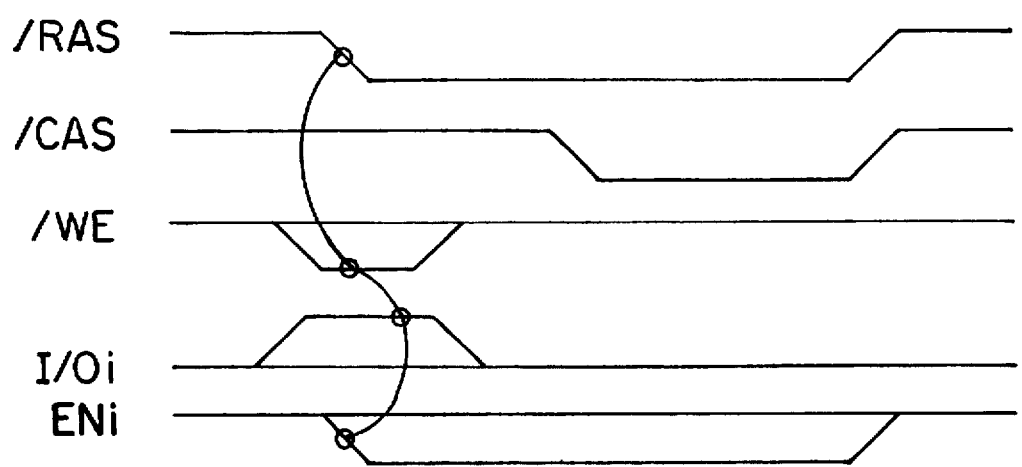
FIG. 6 is a timing diagram illustrating the operation of the internal column address strobe enable signal generation circuit in FIG. 5.

FIG. 6 is a timing diagram illustrating the operation of the internal CAS enable signal generation circuit 36 in FIG. 5. When the input/output signal I/Oi is high in logic under the condition that the row address strobe bar signal /RAS is low in logic, the external column address strobe bar signal /CAS is high in logic and the write enable signal /WE is low in logic, the internal CAS enable signal ENi is made inactive to disable the corresponding internal column address strobe signal cas. If this is not the case, the internal CAS enable signal ENi is made active to enable the corresponding internal column address strobe signal cas.

As is apparent from the above description, according to the present invention, one external column address strobe bar pin is used to generate internal multiple column address strobe signals. Therefore, the package size can be reduced to satisfy the miniaturization desired by the system manufacturer. Furthermore, the use of one external column address strobe bar pin has the effect of avoiding a time skew between external multiple column address strobe bar signals.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A dynamic random access memory comprising:
   a cell array for storing data therein;
   a column address strobe bar buffer for generating at least one internal column address strobe signal in response to one external column address strobe bar signal to select data from said cell array; and
   control means for generating at least one internal column address strobe enable signal to control the number of internal column address strobe signals from said column address strobe bar buffer;
   wherein said column address strobe bar buffer is adapted to receive said external column address strobe bar signal through one external package pin and to combine the received signal with said at least one internal column address strobe enable signal from said control means to generate said at least one internal column address strobe signal;
   wherein said control means is adapted to generate said at least one internal column address strobe enable signal in response to said external column address strobe bar signal, a row address strobe bar signal, a write enable signal and input/output signal.

2. A dynamic random access memory as set forth in claim 1, wherein said control means is adapted to control a logic state of said at least one internal column address strobe enable signal according to a logic state of said input/output signal.

3. A dynamic random access memory as set forth in claim 1, wherein said at least one internal column address strobe signal from said column address strobe bar buffer is selectively enabled to control a corresponding data path.

* * * * *